(12) United States Patent
Johnson

(10) Patent No.: US 7,109,583 B2
(45) Date of Patent: Sep. 19, 2006

(54) MOUNTING WITH AUXILIARY BUMPS

(75) Inventor: Edwin F. Johnson, Sunnyvale, CA (US)

(73) Assignee: Endwave Corporation, Sunnyvale, CA (US)

( * ) Notice: Subject to any disclaimer, the term of this patent is extended or adjusted under 35 U.S.C. 154(b) by 0 days.

(21) Appl. No.: 10/841,764

(22) Filed: May 6, 2004

(65) Prior Publication Data

US 2005/0248031 A1    Nov. 10, 2005

(51) Int. Cl.
*H01L 23/48* (2006.01)

(52) U.S. Cl. .................. 257/734; 257/E21.515

(58) Field of Classification Search ........... 257/785, 257/786
See application file for complete search history.

(56) References Cited

U.S. PATENT DOCUMENTS

| | | |
|---|---|---|
| 3,591,839 A | 7/1971 | Evans |
| 3,657,610 A | 4/1972 | Yamamoto et al. |
| 3,811,186 A | 5/1974 | Larnerd et al. |
| 4,051,508 A | 9/1977 | Sato et al. |
| 4,184,043 A | 1/1980 | Hildering |
| 4,263,606 A | 4/1981 | Yorikane |
| 4,764,804 A | 8/1988 | Sahara et al. |
| 4,922,322 A | 5/1990 | Mathew |
| 5,071,787 A | 12/1991 | Mori et al. |
| 5,108,950 A | 4/1992 | Wakabayashi et al. |
| 5,143,865 A | 9/1992 | Hideshima et al. |
| 5,149,671 A | 9/1992 | Koh et al. |
| 5,186,383 A | 2/1993 | Melton et al. |
| 5,214,308 A * | 5/1993 | Nishiguchi et al. ......... 257/692 |
| 5,220,200 A | 6/1993 | Blanton |
| 5,235,140 A | 8/1993 | Reele et al. |
| 5,283,446 A | 2/1994 | Tanisawa |
| 5,302,854 A * | 4/1994 | Nishiguchi et al. ......... 257/737 |
| 5,393,696 A | 2/1995 | Koh et al. |
| 5,462,217 A | 10/1995 | Simmons et al. |
| 6,046,910 A * | 4/2000 | Ghaem et al. ............. 361/760 |
| 6,507,121 B1 * | 1/2003 | Huang ...................... 257/780 |
| 6,677,677 B1 * | 1/2004 | Kimura et al. ............. 257/737 |
| 2002/0050381 A1 * | 5/2002 | Takao ........................ 174/52.1 |
| 2002/0153092 A1 * | 10/2002 | Rinne ......................... 156/278 |
| 2003/0001286 A1 * | 1/2003 | Kajiwara et al. ........... 257/778 |
| 2003/0060035 A1 * | 3/2003 | Kimura et al. ............. 438/626 |
| 2003/0092326 A1 * | 5/2003 | Nishikawa et al. ........ 439/894 |

\* cited by examiner

*Primary Examiner*—Evan Pert
*Assistant Examiner*—Benjamin P. Sandvik
(74) *Attorney, Agent, or Firm*—Kolisch Hartwell, PC

(57) ABSTRACT

An electronic circuit can be produced by placing an electrically conductive compressible circuit bump on a circuit electrode of a mounting surface of first and second circuit devices, such as an integrated circuit and a base substrate. One or more auxiliary bumps can also be placed on one or both of the mounting surfaces of the circuit devices. During mounting, the first circuit device can be positioned over the second circuit device with the circuit bumps connecting circuit contacts on the two mounting surfaces. Pressure can be applied so that the circuit bumps and the auxiliary bumps are compressed between the chip and the base device sufficiently for adhering at least the circuit bumps to the circuit contacts.

12 Claims, 4 Drawing Sheets

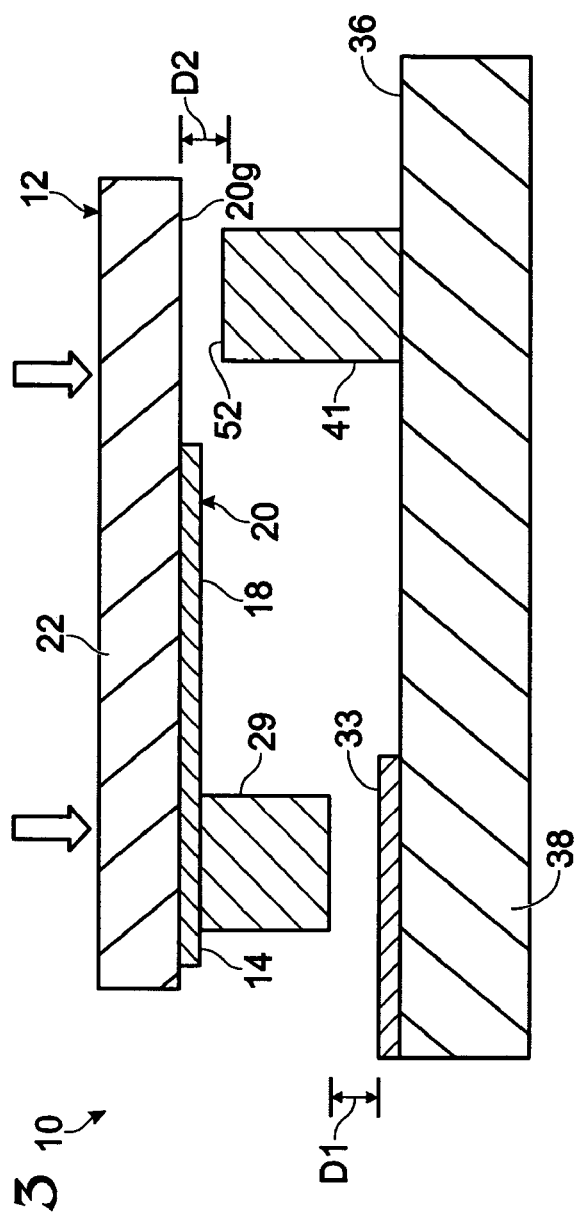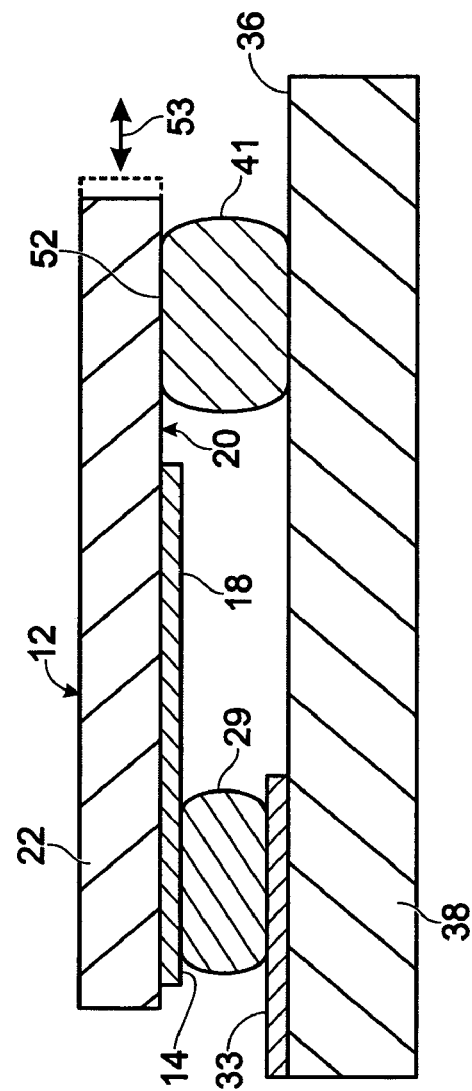

MOUNTING WITH AUXILIARY BUMPS

BACKGROUND

The disclosed devices relate to an electrical circuit formed by mounting two electrical circuit devices together with interconnections between electrodes on facing surfaces, and with auxiliary elements disposed between the two circuit devices at positions spaced from the interconnections.

Electrical circuits can be formed by mounting one circuit device onto another circuit device and connecting electrodes on the respective circuit devices. The devices, such as chips, dies, integrated circuits, printed circuits and other devices formed on a substrate, have electrodes that are distributed around the periphery of a planar mounting surface and sometimes on the interior. In one mounting method, conductive bumps are applied to the electrodes of one device and the bumps are pressed against corresponding electrodes of another device. The electrodes are typically distributed around the edges of one of the devices, so the force applied to the devices is relatively balanced by the distributed bumps. This mounting method is referred to as flip mounting.

SUMMARY

A first circuit device and a second circuit device are mounted together with face-to-face electrodes interconnected. Disclosed embodiments include mounting elements interconnecting opposing electrodes as well as auxiliary elements. A first circuit device can have a first mounting surface including at least one first circuit contact. Similarly, a second circuit device can have a second mounting surface including at least one second circuit contact, with the second mounting surface facing the first mounting surface. A conductive compressed interconnection, formed of a material suitable for compression bonding, can interconnect a pair of opposing circuit contacts. In some embodiments, at least one auxiliary mounting element can be positioned between the first and second mounting surfaces at a location spaced from the circuit contacts.

BRIEF DESCRIPTION OF THE DRAWINGS

FIG. 3 is an exaggerated cross section of the electrical circuit of FIG. 1 immediately prior to mounting.

FIG. 4 is a cross section similar to FIG. 3 taken along line 4—4 in FIG. 2, showing the electrical circuit after mounting.

DESCRIPTION OF THE PREFERRED EMBODIMENTS

Figure 1:
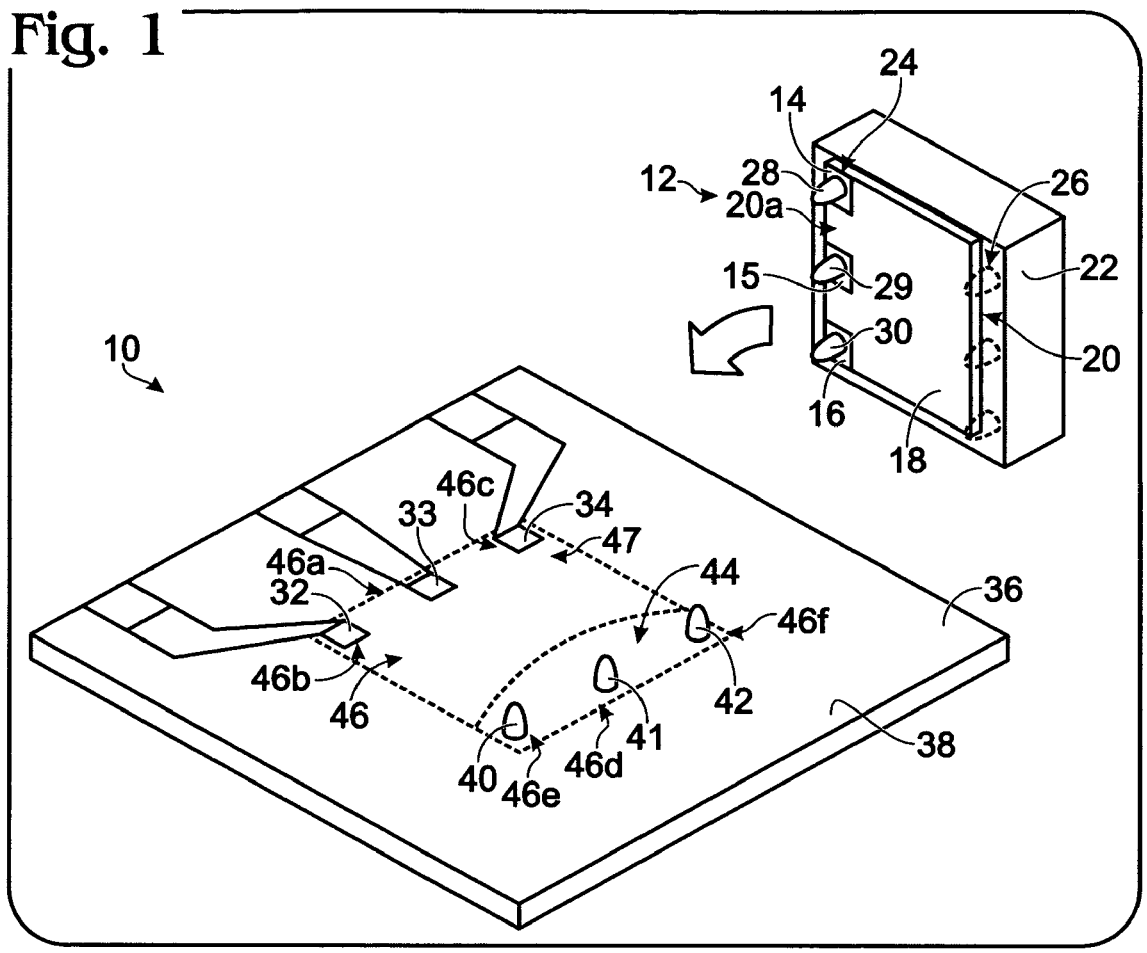
FIG. 1 is a simplified isometric view of an electrical circuit including first and second circuit devices prior to mounting.

This disclosure includes circuit devices that are mounted together with interconnections that interconnect circuits on the circuit devices. A circuit can include an electrical or electromagnetic component or device, a configuration of electrically or electromagnetically connected components or devices, as well as a closed path followed or capable of being followed by an electric current. Circuit devices can include, for example, chips, microchips, integrated circuits, dies, printed circuits, chip carriers, circuit boards, and other circuit structures, and can have a body such as a substrate. A substrate can be insulating, conducting or semiconducting in nature, can include one layer or a combination of layers and materials, can be active, passive or inactive in the function of the circuit, and can have planar or non-planar surfaces.

Circuit devices can include one or more circuit contacts through which electrical communication is provided to another circuit device. A circuit contact, which can include an electrode, terminal, or other element on the device, is typically a layer, strip or pad of conductive or semiconductive material, and it can be of any form or material that provides for functional interface between the associated circuit device and a circuit mounting element, such as a conductive mounting element, also referred to as an interconnection. A mounting element may be of any suitable shape, size or material that provides support between the circuit devices during or after mounting, and may be formed by any suitable technique. A mounting element is of a type that is compressible and useable in a pressure-based mounting technique, such as thermocompression bonding, thermosonic bonding, cold welding, or fusion bonding, in which the mounting element is compressed between the mounting surfaces of the circuit devices.

It has been found in designing circuits having face-to-face mounted circuit devices, particularly for use at microwave and millimeter wave frequencies, that circuit operation and performance characteristics are enhanced if the electrodes are placed as defined by the circuit rather than by the chip geometry. However, in some applications and designs, there can be a significant region of the chip surface, such as adjacent to one or more sides or corners, that is unsupported, or insufficiently or incompletely supported, by mounting elements, such as mounting bumps, placed on circuit device electrodes. In other words, the positions of such electrodes may be located in a variety of configurations. These configurations can be unbalanced or unsymmetrical relative to the center of a mounting surface; with the result that there can be one or more regions inadequately supported by electrode-mounted bumps.

One solution is to design the chip so that the electrically conductive bumps provide balanced support for the chip. This can result in modified circuit designs that compromise the functions or operations of the circuits.

Circuit design can be simplified with the placement of auxiliary elements between mounting surfaces of the two circuit devices. The auxiliary elements can be spaced from the circuit electrodes. An auxiliary element can be a bump that is not an essential part of the electrical circuit formed by the combination of mounting device and base device. This allows placement of the circuit contacts on the mounting device according to circuit requirements substantially without regard for the geometry of the mounting surfaces.

As an example, an electrical circuit can include a mounting device, such as a chip, having a circuit contact on a planar mounting surface, and a base device, such as a motherboard, with a planar mounting surface on which is mounted at least one electrode associated with a circuit contact on the base device. The base device typically includes a substrate on which or in which a circuit is formed or fabricated.

In some examples, a compressible auxiliary element, such as an auxiliary bump, is mounted on one of the mounting surfaces of the mounting device and the base device spaced from a circuit bump and associated circuit contacts. The mounting device is positioned over a mounting surface of the base device with the circuit bump contacting the other of the pair of associated contacts, and with the at least one auxiliary bump contacting the opposing mounting surfaces of the mounting device and the base device. Pressure can be applied so that the circuit bump and the auxiliary bump are compressed between the mounting device and the base device sufficiently for adhering the circuit bump to the contacts. The auxiliary bumps can be made of the same material as the circuit bumps. This can simplify construction of the auxiliary bumps and can make the forces applied to the circuit and auxiliary bumps more uniform.

FIGS. 1–5 illustrate an example of an electrical circuit 10 and a method of making the circuit. Circuit 10 includes a first circuit device, referred to as a mounting device or chip 12, with a plurality of circuit contacts, such as electrodes 14, 15, and 16. In this embodiment, these electrodes are integral with a circuit element in the form of a planar conductive device or resonator 18 formed on a mounting surface 20 of an electronic circuit substrate 22. Electrodes 14–16 are disposed along one edge 20a, including corners 20b and 20c, of the mounting surface in a contact region 24. Opposite from region 24, along an edge 20d, including corners 20e and 20f, is a second, auxiliary region 26 that is opposite and spaced from the electrodes and contact region 24. In region 26, a portion 20g of mounting surface 20 includes a corresponding portion of the face of substrate 22 that is exposed. Mounting surface 20 can be considered to include the exposed surfaces on the underside of chip 12, as shown.

Surface 20 can accordingly include the surface of substrate 22 or any layer or material existing on the surface of substrate 22, such as electrodes 14–16 or resonator 18. Further, in this case, the entire underside of the chip may be considered to be mounting surface 20, although it may be only a portion of the underside, depending upon the structures and relative positions of the circuit devices being mounted together. For instance, if a portion of each circuit device extends beyond the edge of the other circuit device, the mounting surface may be limited to the common areas of overlap. In the present example, the mounting surface is that portion of the underside of chip 22 that faces a base circuit device 38 described below.

Circuit mounting elements, referred to as circuit bumps 28, 29 and 30, are shown mounted on electrodes 14, 15 and 16, respectively. These bumps are referred to as circuit bumps in that they provide an electrical path between the electrodes on the chip and respective metallization strips terminating in circuit contacts 32, 33 and 34 mounted on a surface 36 of base circuit device 38. These circuit contacts and the electrodes form associated pairs of circuit contacts 14 and 32, 15 and 33, and 16 and 34.

Three auxiliary bumps 40, 41 and 42, that also function as mounting elements, are mounted in an auxiliary region 44 of a chip mounting surface 46 on surface 36. Mounting surface 46 corresponds to the area of surface 36 adjacent to which chip 12 is to be mounted, and region 44 corresponds to region 26 on chip 12. The positions where bumps 40, 41 and 42 contact chip 12 are shown in dashed lines in region 26 in FIGS. 1 and 5. Correspondingly, mounting surface 46 includes an edge 46a, including corners 46b and 46c, of the mounting surface in a contact region 47. Opposite from region 47, along an edge 46d, including corners 46e and 46f, is second, auxiliary region 44, which is opposite and spaced from the electrodes and contact region 47.

Figure 5:
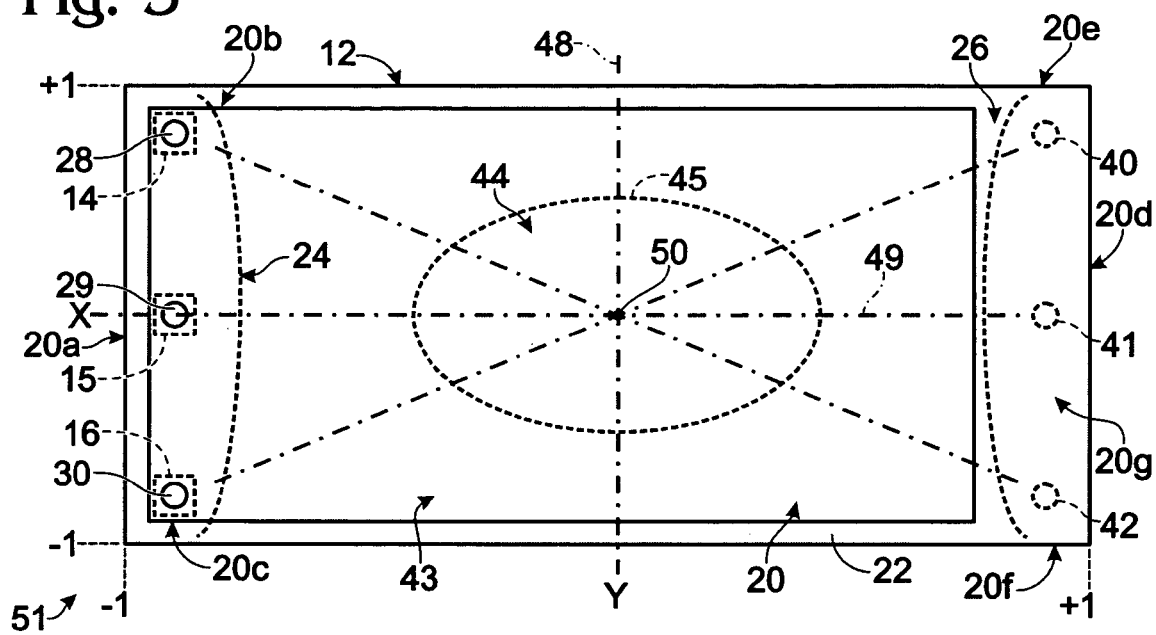
FIG. 5 is an enlarged view of an example of a mounting surface of a circuit device that can be mounted as illustrated in FIGS. 1 and 2.

As particularly shown in FIG. 5, it is seen that there is an auxiliary bump opposite each circuit bump, and the auxiliary bumps are symmetrically placed opposite from the circuit bumps relative to an axis 48 of symmetry passing through a center 50 of and coplanar with mounting surface 20, as well as relative to center 50. The auxiliary bumps thus form a mirror image of the circuit bumps relative to axis 48.

In a more general sense, the auxiliary bumps used in electrical circuit 10 allow the application of a mounting force that is centered on chip 12 during mounting. For instance, if only circuit bumps 28, 29 and 30 were used, a force directly in line with the circuit bumps would be required in order to avoid directly pressing edge 20d against base device 38. In other terms, the force would generally be applied in alignment with the centroid of the circuit bumps in order to provide even pressure on the circuit bumps and balanced force on the chip.

The positions of the bumps during mounting determine how a mounting force is applied, so it does not matter on which of the mounting surfaces a bump is initially placed. A reference to a bump being on one mounting surface correspondingly includes a configuration where the bump is on the other mounting surface. A definition of a centroid $(\overline{X}, \overline{Y})$ is $$(\overline{X}, \overline{Y}) = \frac{1}{\sum_{i=1}^{N} A_i} \sum_{i=1}^{N} (A_i X_i, A_i Y_i) \quad (1)$$

where $(X_i, Y_i)$ represents the coordinates in a Cartesian coordinate system having an origin coincident with the center of the mounting surface, and $A_i$ represents the relative value of a particular bump, such as the size, thickness, density, force resistance or other weighting factor. For example, in FIG. 5, point 50 is the center of mounting surface 20 as well as the origin of a coordinate system 51 having an x-axis 49 and a y-axis 48. The three circuit bumps 28, 29 and 30 have a centroid coincident with bump 29, assuming the bumps are assigned equal weighting. With auxiliary bumps 40, 41 and 42 mounted equal distances opposite from the three circuit bumps, a resultant centroid for all of the bumps will be coincident with the center 50 of the mounting surface.

Ideally the center of force applied to a circuit device during mounting is substantially coincident with the center of the device, which corresponds with the center of the mounting surface of the device. The closer the centroid of the combination of circuit and auxiliary bumps is to the center of the mounting surface, the more evenly the pressure is applied to the various bumps. When the circuit bumps are predominantly on one side of the center, improvement is obtained by placing auxiliary bumps that are predominantly on another side of the center, and in particular on the opposite side of the center. Thus, the addition of auxiliary bumps that shift the centroid from the centroid of the circuit bumps toward the center of the mounting surface is an improvement.

The center of force applied to a circuit device can be in the general proximity of the centroid, such as within a distance of one half of the distance from the center to the outer edge of the mounting surface, as illustrated by central region 44 defined by dashed line 45. A region 43 outside of dashed line 45 accordingly may be considered the general periphery of the mounting surface.

To obtain an improved centroid for the combination of bumps, positions and characteristics of auxiliary bumps can be selected so that $$\sqrt{|\overline{X_{C+A}}|^2 + |\overline{Y_{C+A}}|^2} < \sqrt{|\overline{X_C}|^2 + |\overline{Y_C}|^2},$$

where the subscripts C and A indicate circuit and auxiliary bumps, respectively, $|\overline{X_{C+A}}|$ and $|\overline{Y_{C+A}}|$ represent the absolute values of the coordinates for the centroid for the combination of circuit and auxiliary bumps, and $|\overline{X_C}|$ and $|\overline{Y_C}|$ represent the absolute values of the coordinates for the centroid for the circuit bumps. To obtain a centered centroid for the combination of bumps, auxiliary bumps can be selected such that $$\frac{1}{\sum_{i=1}^{N} A_i} \sum_{i=1}^{N} (A_i X_{Ci}, A_i Y_{Ci}) = -\left[ \frac{1}{\sum_{j=1}^{M} B_j} \sum_{j=1}^{M} (B_j X_{Aj}, B_j Y_{Aj}) \right],$$

or $(\overline{X_C}, \overline{Y_C}) = (-\overline{X_A}, -\overline{Y_A})$, where $A_i$ and $B_j$ represent weighting values of respective circuit and auxiliary bumps, and N and M are the respective number of circuit and auxiliary bumps. N and M do not need to be equal, and for i=j, $A_i$ and $B_j$ do not need to be equal and $(X_i, Y_i)$ and $(X_j, Y_j)$ do not need to be equal in absolute value.

FIG. 1 shows chip 12 tilted next to base device 38 so that the mounting surfaces of each are visible. It is seen that the circuit bumps are mounted on the electrodes of the chip and the auxiliary bumps are mounted on the mounting surface of the base device. Each of the circuit and auxiliary bumps may be mounted initially on either device. FIG. 3 shows the chip in position above the base device, prior to contact, with the circuit bumps aligned over the circuit contacts on the base device, and the auxiliary bumps aligned with the auxiliary region of the mounting surface of the chip. In FIG. 3, the separation D1 between the circuit bump 29 and contact pad 33 and the separation D2 between auxiliary bump 41 and mounting surface 20 are substantially equal. In this example, the heights of the auxiliary bumps are more than the heights of the circuit bumps, in order to compensate for the thicknesses of the contacts on the mounting surfaces of the mounting device and the base device. These dimensions tend to keep the mounting device and base device parallel during mounting. Equal spacing between each bump and an associated mounting surface is not necessary, nor is it necessary that the height of the auxiliary bump correspond to the height of the circuit bump and associated circuit contact. Other, unequal configurations can also be used.

Figure 2:
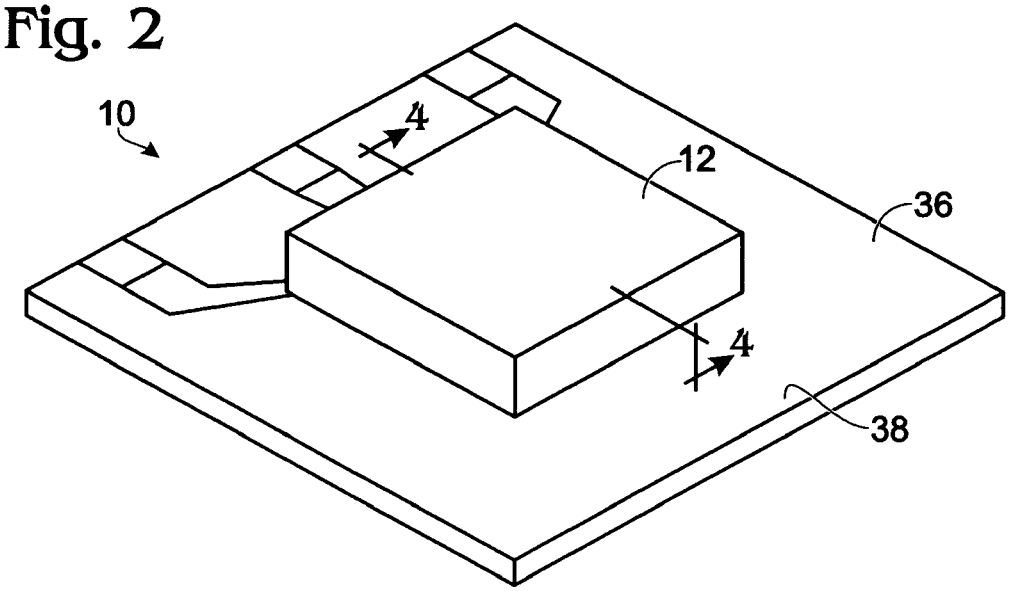
FIG. 2 is a view of the electrical circuit of FIG. 1 after mounting.

FIGS. 2 and 4 show apparatus 10 after thermocompression mounting of the chip on the base device. Construction of the bumps can be facilitated by forming the auxiliary bumps and the circuit bumps out of the same material, such as gold or a gold alloy. The pressures applied to the bumps are also more even when the bumps are made of the same material, or materials having similar compression characteristics. Because of the softness of gold, the sizes of the auxiliary bumps relative to each other and relative to the circuit bumps do not have to be uniform. As has been mentioned, more or fewer auxiliary bumps may be provided relative to the number of circuit bumps. Auxiliary bumps distributed in areas devoid of circuit bumps, particularly along portions of the chip periphery, better balance and distribute the forces of mounting between the chip and the base device. It is clear that without the auxiliary bumps, the right edge of chip 12 could press directly on the base device, possibly resulting in damage to the chip and the base device. Stability of the chip during mounting is improved when the auxiliary bumps are predominantly to the right of axis 48, as viewed in FIG. 5, and therefore generally on the side opposite from the circuit bumps.

Gold bumps generally adhere readily to metal, such as to the circuit contacts. Gold does not adhere as well to other materials, such as some insulating and semi-insulating materials, including, for example, alumina, beryllia, glass or ceramic, out of which the substrates of the base and mounting devices can be made. This produces a further advantage in the embodiment shown in FIGS. 1–5, in that the chip substrate is movable in the plane of the mounting surface relative to the abutting face of the auxiliary bump, such as face 52 of bump 41 shown in FIG. 4. This movement of chip 12 is illustrated by double-arrow 53, without corresponding movement of bump 41. This feature allows for expansion and contraction of chip 12 relative to substrate 38 due primarily to temperature fluctuations in the respective substrates. This is particularly advantageous when the chip contains heat-generating active or passive components, such as a transistor. This reduces the stress put on the circuit bumps and makes the circuit structure more durable.

Figure 6:
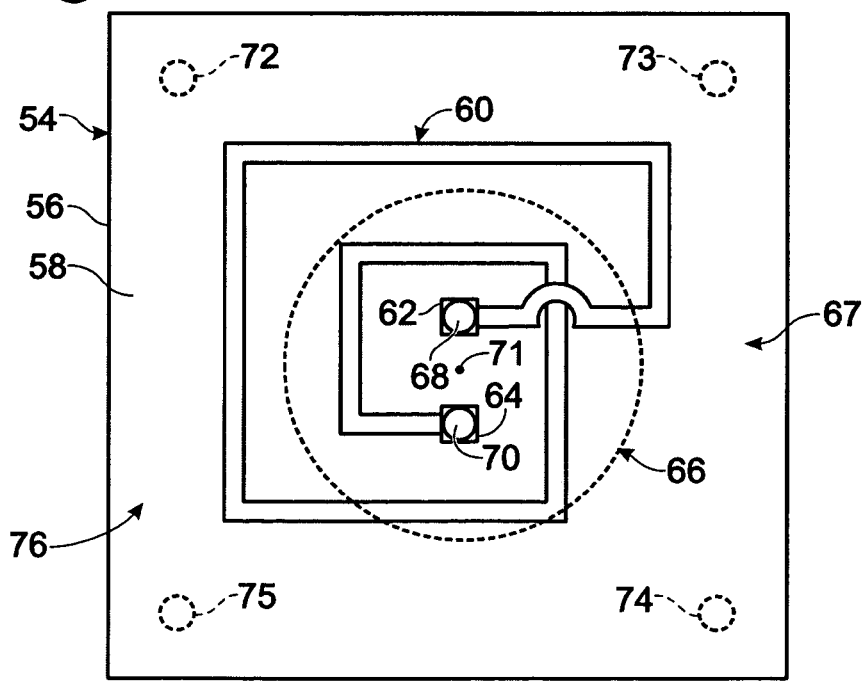
FIG. 6 is a view of a mounting surface of another circuit device mountable on a second corresponding circuit device.

A second example of a circuit device supported on both circuit and auxiliary bumps, is illustrated in FIG. 6 as a chip 54. Chip 54, for purposes of illustration, has a chip substrate 56 with a surface 58 on which is mounted a coil 60. The circuit contact electrodes 62 and 64 for the coil are positioned in close proximity in a central region 66 of substrate surface 58. The illustrated surface of chip 54, including the exposed surfaces of the substrate, coil and electrodes forms a mounting surface 67.

Circuit bumps 68 and 70 are mounted onto electrodes 62 and 64 during use, with chip 54 mounted onto a base circuit device, not shown. If support of the chip were limited to circuit bumps 68 and 70, the chip would be very unstable, and mounting forces would have to be applied very precisely, even though the centroid of the circuit bumps is midway between the circuit bumps, at a mounting surface center 71.

In order to compensate for this, an auxiliary bump can be positioned at each corner, as is illustrated by phantom bumps 72, 73, 74 and 75. These bumps are positioned in a peripheral region 76 spaced from the electrodes in central region 66. This assures a broad, stable base of support for the chip during and after mounting, and also maintains mounting surface 67 generally horizontal with the mounting surface of a base circuit device during mounting of chip 54 onto a base circuit device.

Figure 7:
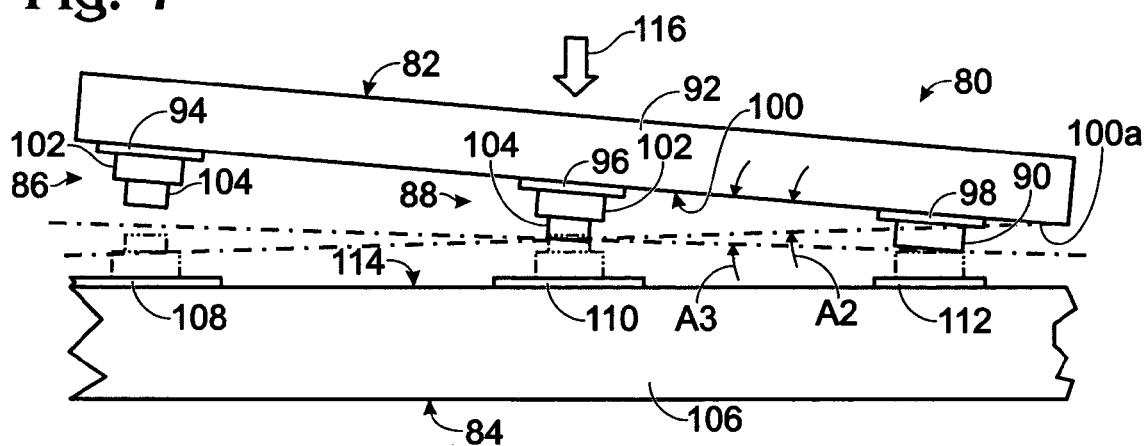
FIG. 7 is a side view of another electrical circuit showing a first circuit device in an optional position prior to mounting on a second circuit device.
Figure 8:
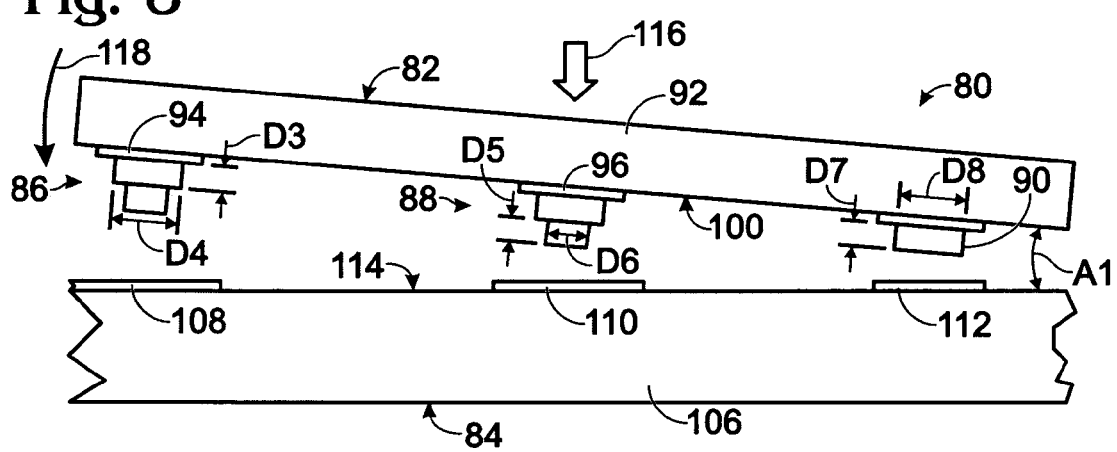
FIG. 8 is a side view of the electrical circuit of FIG. 7 during one example of mounting.
Figure 9:
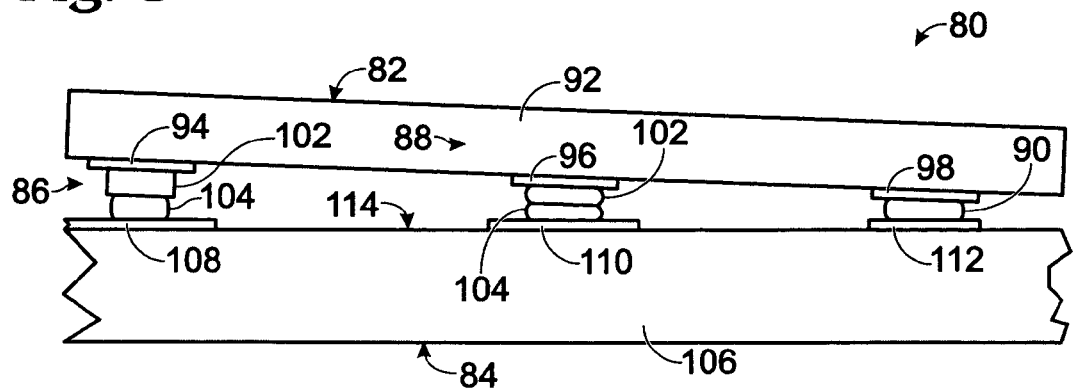
FIG. 9 is a side view of the electrical circuit of FIG. 7 illustrating one example of the electrical circuit after mounting.

FIGS. 7, 8 and 9 illustrate a simple electrical circuit 80 including a first circuit device 82, a second circuit device 84, exemplary circuit mounting bumps 86 and 88, and an exemplary auxiliary bump 90. First circuit device 82 includes a substrate 92, circuit electrodes 94 and 96, and an auxiliary pad 98. A mounting surface 100 of the first circuit device accordingly includes the downwardly facing surfaces, as viewed in the figures, of substrate 92, circuit electrodes 94 and 96, and auxiliary pad 98. In this example, bumps 86 and 88 include a first layer 102 having a thickness D3 and a width D4, and a second layer 104 having a thickness D5 and a width D6. Although various bump dimensions may be used, including different dimensions for different bumps, layers 102 and 104 can have the same thickness, such as 11 microns. The layers 102 can have the same width, such as 40 microns, with layers 104 having a reduced width, such as 30 microns.

In this example, rather than being taller than the circuit bumps, auxiliary bump 90 has a single layer having a thickness D7 and a width D8 that are the same as layer 102 of the circuit bumps. As a result, the auxiliary bumps can be formed in the same processing step as layers 102 of the circuit bumps. Similarly, even though it does not have an electrical circuit function, auxiliary pad 98 can be made the same as the circuit electrodes, and be made at the same time.

Second circuit device 84 includes a substrate 106, circuit electrodes 108 and 110, and an auxiliary pad 112. A mounting surface 114 is formed by the surfaces of the substrate, electrodes and pad facing first circuit device 82 corresponding to mounting surface 100.

In some applications, substrate 92 of first circuit device 82 can have a length that is close to two orders of magnitude longer than the width of the bumps, such as a substrate length of 2 mm, or 2000 microns. With a total circuit bump height of 22 microns, it can be necessary to mount first circuit device 82 to second circuit device 84 with the mounting surfaces within an angle A1, shown in FIG. 8, of 0.6 degrees from parallel. In such applications, this means that one edge of the mounting surface first circuit device is no more than about 20 microns closer or further from the mounting surface of the second circuit device compared to the opposite edge.

Referring to FIG. 7 in particular, an angle A2 indicates the angle that would exist between mounting surface 100 and mounting surface 114, if auxiliary bump 90 and associated pad 98 did not exist, and an edge 100a, distal from circuit bump 86, contacted mounting surface 114. With the existence of auxiliary bump 90 close to edge 100a, then bump 90, rather than the edge of mounting surface 100, contacts mounting surface 114. The angle A3 represents this reduced angle that is related to the relative sizes of the circuit and auxiliary bumps. For an auxiliary bump having a height of about one-half of the height of the circuit bump, angle A3 is about half of angle A2.

When a bond head or other mounting apparatus, not shown, applies a downward force on first circuit device 82, as represented by arrow 116, the relative angle between mounting surfaces 100 and 114 will be limited to angle A3. As shown in FIG. 8, when mounting surface 100 is oriented at an angle A1 greater than A3, auxiliary bump 90 contacts mounting surface 114 before circuit bumps 86 and 88 do. This causes first circuit device 82 to pivot, as represented by arrow 118, about the point of contact of bump 90 on auxiliary pad 112 until circuit bump 88 contacts mounting surface 114. With continued force on first circuit device 82, second layer 102 of circuit bump 88 compresses, as does auxiliary bump 90. This attaches bump 88 to electrode 110. Since the angle is not as great as shown in FIG. 8 in this example, circuit bump 86 contacts mounting surface 114 as well, and is also compressed sufficiently to attach to electrode 108. A possible resultant mounting position is illustrated in FIG. 9.

As can be seen, then, auxiliary bumps and circuit bumps can have various configurations and functions, depending upon the application. The auxiliary bumps can be placed in any suitable configuration that does not interfere with placement or function of the circuit bumps and balances a chip relative to the base device. As mentioned previously, the circuit and auxiliary bumps may be placed on the mounting surface of either circuit device. Auxiliary bumps can also be mounted on electrodes in addition to the circuit bumps if appropriate. These bumps may or may not be mounted on the contacts of the base device. The auxiliary bumps are not necessarily only for the purpose of support. They may also provide conduction of heat energy, and even possibly electrical energy. The primary and auxiliary bumps may be made of various materials, and do not need to be made of the same material, nor do they necessarily have to have equivalent heights or the same shape. Also, auxiliary bumps may be used in a wide variety of circuit and chip configurations.

It is believed that the disclosure set forth above encompasses multiple distinct apparatus and processes with independent utility. While each of these disclosures has been disclosed in a particular form, the specific examples thereof as disclosed and illustrated herein are not to be considered in a limiting sense as numerous variations are possible. The subject matter of the disclosures includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that correspond to disclosed examples and are novel and non-obvious. Other combinations and subcombinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present disclosure.

What is claimed is:

1. An electrical circuit comprising:
   a first circuit device having a first mounting surface including at least one first circuit contact;
   a second circuit device having a second mounting surface including at least one second circuit contact, the second mounting surface facing the first mounting surface;
   a conductive interconnection formed of a material suitable for compression bonding, and compression bonded to and extending between a first circuit contact and a second circuit contact; and
   at least one compressed auxiliary element also formed of a material suitable for compression bonding, positioned between the first and second mounting surfaces adjacent to a periphery of the first circuit device and spaced from the circuit contacts, the at least one auxiliary element not being mechanically connected to one of the first and second mounting surfaces, thereby allowing movement of the one mounting surface relative to the at least one auxiliary element.

2. An electrical circuit comprising:
   a first circuit device having a first mounting surface including at least one first circuit contact;

a second circuit device having a second mounting surface including at least one second circuit contact, the second mounting surface facing the first mounting surface;

a conductive compressed interconnection formed of a material suitable for compression bonding, and connected to and extending between a first circuit contact and a second circuit contact, each interconnection includes a first layer having substantially a given thickness and a second layer; and at least one auxiliary element formed of a material suitable for compression bonding, positioned between the first and second mounting surfaces and spaced from the circuit contacts, each auxiliary element consisting of a single layer having substantially the given thickness.

3. The circuit of claim 2 of which the second layer of each interconnection is smaller than the first layer.

4. The circuit of claim 3 of which the second layer is also substantially of the given thickness.

5. The circuit of claim 2 of which the at least a first layer of each interconnection and each auxiliary element is made of the same material.

6. The circuit of claim 2 of which each first circuit contact is spaced from a portion of a periphery of the first mounting surface, and at least one auxiliary mounting element is disposed in the portion of the periphery of the first mounting surface.

7. A method of making an electrical circuit comprising:

providing a first circuit device having a first mounting surface and at least one first circuit contact on the first mounting surface;

providing a second circuit device having a second mounting surface including a second circuit contact associated with a respective first circuit contact, the first and second circuit contacts forming at least one pair of associated circuit contacts;

placing an electrically conductive circuit mounting element on at least one circuit contact of each pair of associated circuit contacts;

placing each of at least one auxiliary mounting element on a respective one of the first and second mounting surfaces spaced from the at least one circuit contact on the one mounting surface;

positioning the first circuit device relative to the second circuit device with the first mounting surface facing the second mounting surface, and with each circuit mounting element extending between a pair of associated circuit contacts, and with the at least one auxiliary mounting element positioned between the first and second mounting surfaces; and compressing each circuit mounting element between each pair of associated contacts sufficiently for adhering the first circuit device to the second circuit device, the circuit and auxiliary mounting elements forming, as a result of such compressing, a respective resultant interconnection extending between each pair of associated circuit contacts and having a first total thickness between the pair of associated circuit contacts, and a respective resultant auxiliary mounting element extending between the first and second mounting surfaces and having a second total thickness that is less than the first total thickness.

8. The method of claim 7, further comprising making at least a first circuit mounting element with at least a first layer having substantially the same thickness as a thickness of at least a first auxiliary mounting element, and a second layer of a material suitable for compression bonding.

9. The method of claim 7, further comprising making at least a first circuit mounting element with at least a first layer having substantially the same thickness as a thickness of at least a first auxiliary mounting element, and a second layer substantially of the same thickness as the first layer.

10. The method of claim 8 further comprising forming each resultant auxiliary mounting element to consist of only the first layer.

11. A method of making an electrical circuit comprising:

providing a first circuit device having a first mounting surface and at least one first circuit contact on the first mounting surface;

providing a second circuit device having a second mounting surface including a second circuit contact associated with a respective first circuit contact, the first and second circuit contacts forming at least one pair of associated circuit contacts;

placing an electrically conductive circuit mounting element on one circuit contact of each pair of associated circuit contacts;

placing each of at least one auxiliary mounting element on a respective one of the first and second mounting surfaces spaced from the at least one circuit contact on the one mounting surface;

positioning the first circuit device relative to the second circuit device with the first mounting surface facing the second mounting surface, and with each circuit mounting element extending between a pair of associated circuit contacts, and with the at least one auxiliary mounting element positioned between the first and second mounting surfaces; and compressing each circuit mounting element sufficiently for adhering each circuit mounting element to the other circuit contact associated with the one circuit contact, the other mounting surface that is not the one mounting surface on which the at least one auxiliary mounting element is placed, being made out of a material that does not readily adhere to the at least one auxiliary mounting element, the method further comprising, during compressing each circuit mounting element, pressing the first auxiliary mounting element against the other mounting surface, whereby the other mounting surface remains laterally movable relative to the first auxiliary mounting element.

12. A method of making an electrical circuit comprising:

providing a first circuit device having a first mounting surface and at least one first circuit contact on the first mounting surface;

providing a second circuit device having a second mounting surface including a second circuit contact associated with a respective first circuit contact, the first and second circuit contacts forming at least one pair of associated circuit contacts;

placing an electrically conductive circuit mounting element on at least one circuit contact of each pair of associated circuit contacts;

placing each of at least one auxiliary mounting element on a respective one of the first and second mounting surfaces spaced from the at least one circuit contact on the one mounting surface, at least one of the at least one auxiliary mounting element having a size that is smaller than the circuit mounting element, the one mounting surface being made of a material that does not readily adhere to the at least one auxiliary mounting element during compression bonding;

positioning the first circuit device relative to the second circuit device with the first mounting surface facing the second mounting surface, and with each circuit mounting element extending between a pair of associated circuit contacts, and with the at least one auxiliary mounting element positioned between the first and second mounting surfaces;

compressing each circuit mounting element sufficiently for adhering each circuit mounting element to the other circuit contact associated with the one circuit contact, and compressing the at least one auxiliary mounting element against the one mounting surface without bonding the auxiliary mounting element to the one mounting surface.

* * * * *